(12) United States Patent
Liu et al.

(10) Patent No.: US 8,508,293 B2
(45) Date of Patent: Aug. 13, 2013

(54) AMPLITUDE SHIFT KEYING DEMODULATOR AND METHOD FOR DEMODULATING AN ASK SIGNAL

(75) Inventors: Jiazhou Liu, Shanghai (CN); Dawei Guo, Shanghai (CN); Yangeng Wang, Shanghai (CN)

(73) Assignee: Beken Corporation, Shanghai (CN)

( * ) Notice: Subject to any disclaimer, the term of this patent is extended or adjusted under 35 U.S.C. 154(b) by 20 days.

(21) Appl. No.: 13/405,632

(22) Filed: Feb. 27, 2012

(65) Prior Publication Data
US 2013/0182797 A1 Jul. 18, 2013

(30) Foreign Application Priority Data

Jan. 16, 2012 (CN) .......................... 2012 1 0012422

(51) Int. Cl.
*H03K 9/02* (2006.01)
(52) U.S. Cl.
USPC .......................... 329/311; 329/369; 329/347

(58) Field of Classification Search
USPC .......................... 329/369, 347, 311; 375/353
See application file for complete search history.

(56) References Cited

U.S. PATENT DOCUMENTS

| 6,496,549 | B1 * | 12/2002 | Crawford | 375/320 |
| 7,855,595 | B2 * | 12/2010 | Nehrig et al. | 329/311 |
| 7,876,150 | B2 * | 1/2011 | Iwata et al. | 329/311 |
| 2009/0243716 | A1 * | 10/2009 | Yamazaki et al. | 329/369 |

* cited by examiner

*Primary Examiner* — Joseph Chang
(74) *Attorney, Agent, or Firm* — Perkins Coie LLP; Aaron Wininger

(57) ABSTRACT

An ASK demodulator comprises a rectification circuit which receives and rectifies an ASK signal to generate a rectified current; an active load circuit is coupled to the rectification circuit and receives the rectified current and present an impedance which is inversely proportional to at least a part of the rectified current when a frequency of a base band signal meets a preset condition; a comparator is coupled to the rectification circuit and the active load circuit and receives a reference voltage and a voltage generated based on, at least in part, the rectified current and the impedance, and compares the reference voltage and the generated voltage to generate a demodulated signal.

7 Claims, 7 Drawing Sheets

AMPLITUDE SHIFT KEYING DEMODULATOR AND METHOD FOR DEMODULATING AN ASK SIGNAL

CLAIM OF PRIORITY

This application claims priority to Chinese Application No. 201210012422.1 filed on Jan. 16, 2012, which is incorporated herein by reference.

TECHNICAL FIELD

The present application relates to amplitude shift keying (ASK) demodulation, particularly to an ASK demodulator for ASK demodulation.

BACKGROUND

ASK modulation is widely adopted in communication systems. For example, in Electronic Toll Collection (ETC) systems, a wake-up signal broadcasted by an Road Side Unit (RSU) is typically modulated with ASK.

Conventionally, to conserve power, an ASK signal is demodulated by means of Schottky Barrier Diodes (SBD) or source followers. However, SBDs are not compatible with CMOS integration while source followers can only achieve very limited gains.

Therefore, a new demodulator with controlled power consumption and adequate gain is required.

SUMMARY OF THE INVENTION

In an embodiment of the invention, an ASK demodulator comprises a rectification circuit configured to receive and rectify an ASK signal to generate a rectified current; an active load circuit coupled to the rectification circuit and configured to receive the rectified current and present an impedance which is inversely proportional to at least a part of the rectified current when a frequency of a base band signal meets a preset condition; a comparator coupled to the rectification circuit and the active load circuit and configured to receive a reference voltage and a voltage generated based on, at least in part, the rectified current and the impedance, compare the reference voltage and the generated voltage to generate a demodulated signal.

In an embodiment of the invention, a method for demodulating an ASK signal comprises receiving and rectifying an ASK signal by a rectification circuit to generate a rectified current; receiving the rectified current and presenting an impedance which is inversely proportional to at least a part of the rectified current by an active load circuit when a frequency of a base band signal meets a preset condition; comparing a reference voltage with a voltage generated based on, at least in part, the rectified current and the impedance to generate a demodulated signal.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Various aspects and examples of the invention will now be described. The following description provides specific details for a thorough understanding and enabling description of these examples. Those skilled in the art will understand, however, that the invention may be practiced without many of these details. Additionally, some well-know structures or functions may not be shown or described in detail, so as to avoid unnecessarily obscuring the relevant description. The terminology used in the description presented below is intended to be interpreted in its broadest reasonable manner, even though it is being used in conjunction with a detailed description of certain specific examples of the invention. Certain terms may even be emphasized below, however, any terminology intended to be interpreted in any restricted manner will be overtly and specifically defined as such in this Detailed Description section.

Figure 1:
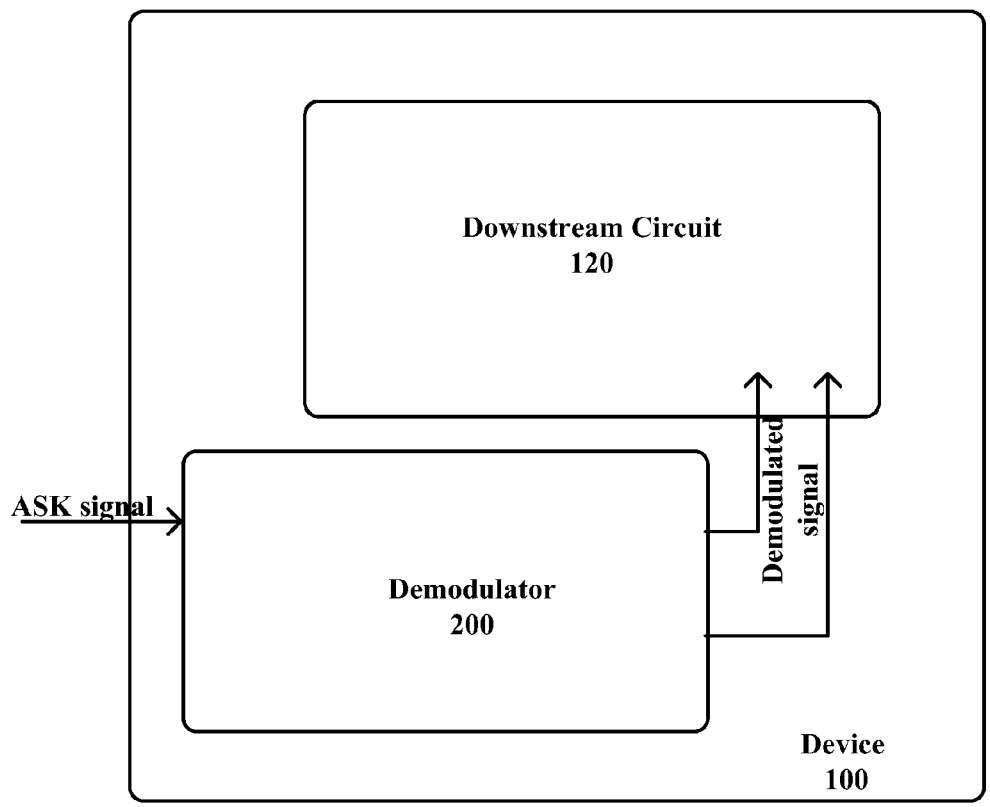
FIG. 1 is a block diagram illustrating a device including an ASK demodulator according to an embodiment of the invention.

FIG. 1 is a block diagram illustrating a device 100 including an ASK demodulator 200 according to an embodiment of the invention.

As shown in FIG. 1, a device 100 receives an ASK signal which is demodulated by a demodulator 200 to generate and provide a downstream circuit 120 a demodulated signal. In various embodiments of the invention, the device 100 can be any device which receives an ASK signal. Examples of such devices include, but are not limited to, on board units (OBU) in an electronic toll collection (ETC) system. In the ETC system, an ASK signal is generated by a road side unit (RSU) by modulating a radio frequency carrier (e.g., 5.83 or 5.84 GHz) by a wakeup signal (e.g., 14 KHz). The demodulator 200 receives and demodulates the ASK signal so as to provide the wakeup signal to the downstream circuit 120 (e.g., a wakeup circuit in this embodiment), wherein the wakeup circuit 120 has been configured to be wakened by a signal with certain frequency, e.g., 14 KHz.

A low power consumption demodulator with adjustable gain will be described in detail below with reference to FIGS. 2-5, wherein the gain may be automatically adjusted in response to the ASK signal, e.g., an average power of the ASK signal. Therefore, the demodulator is provided with a dynamic range which is broader compared with conventional ASK demodulators. For example, when the average power of the ASK signal increases, in some embodiments of the invention, the gain decreases so as to prevent the demodulator from being saturated, i.e., to keep the demodulator capable of identify digital 1 from digital 0 in the ASK signal. In some embodiments, when the average power of the ASK signal decreases (i.e., the ASK signal in this condition is typically referred to as a "small signal"), the gain will increase so that an additional amplifier is not required, therefore the demodulator is particularly adapted to low power circumstances.

Figure 2:
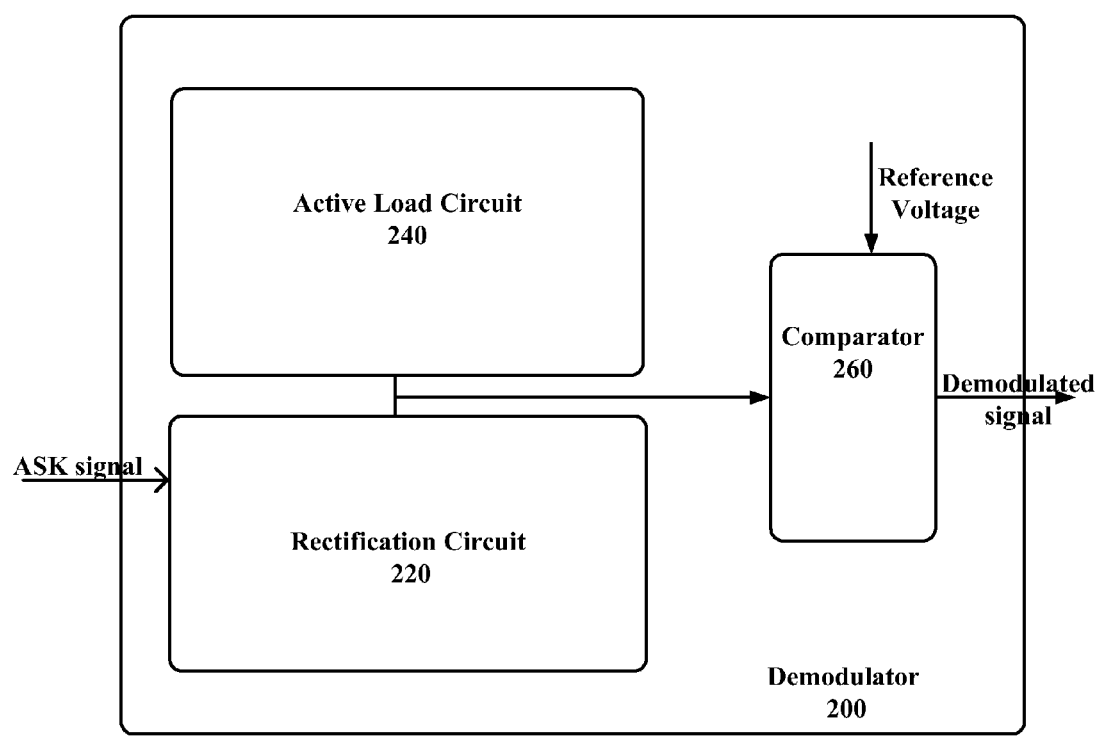
FIG. 2 is a block diagram illustrating a demodulator in FIG. 1 according to an embodiment of the invention.

FIG. 2 is a block diagram illustrating the demodulator 200 in FIG. 1 according to an embodiment of the invention. The demodulator 200 comprises a rectification circuit 220, an active load circuit 240 and a comparator 260.

When the ASK signal is received by the rectification circuit 220, a rectified current can be generated because of the non-linearity of the rectification circuit 220. The rectified current may include a direct current (DC) component determined by an average power of the ASK signal and an alternating current (AC) component determined by a strength and modulation depth of the ASK signal.

The active load circuit 240 is coupled to the rectification circuit 220 and configured to receive the rectified current and present an impedance which is inversely proportional to at least a part of the rectified current, e.g., the DC component thereof, when a frequency of the wake-up signal (base band signal) meets a preset condition. In an embodiment, the impedance has such a relationship with the rectified current when the frequency of the base band signal is within a predetermined frequency range.

A voltage determined by the rectified current and the dynamic impedance is received and compared with a reference voltage by the comparator 260. In an embodiment, the reference voltage is equal to an average of the voltage so that the comparator 260 can identify digital 1 and digital 0 in the ASK signal. Accordingly, when the average power of the ASK signal is relatively high, a gain shown by the generated voltage can be limited by the impedance of the active load circuit 240, when the average power of the ASK signal is relatively low, the gain can be enlarged by the impedance of the active load circuit 240.

The comparator 260 coupled to the rectification circuit 220 and the active load circuit 240 and configured to receive a reference voltage and a voltage generated based on, at least in part, the rectified current and the impedance, compares the reference voltage and the generated voltage to generate a demodulated signal.

Figure 3:
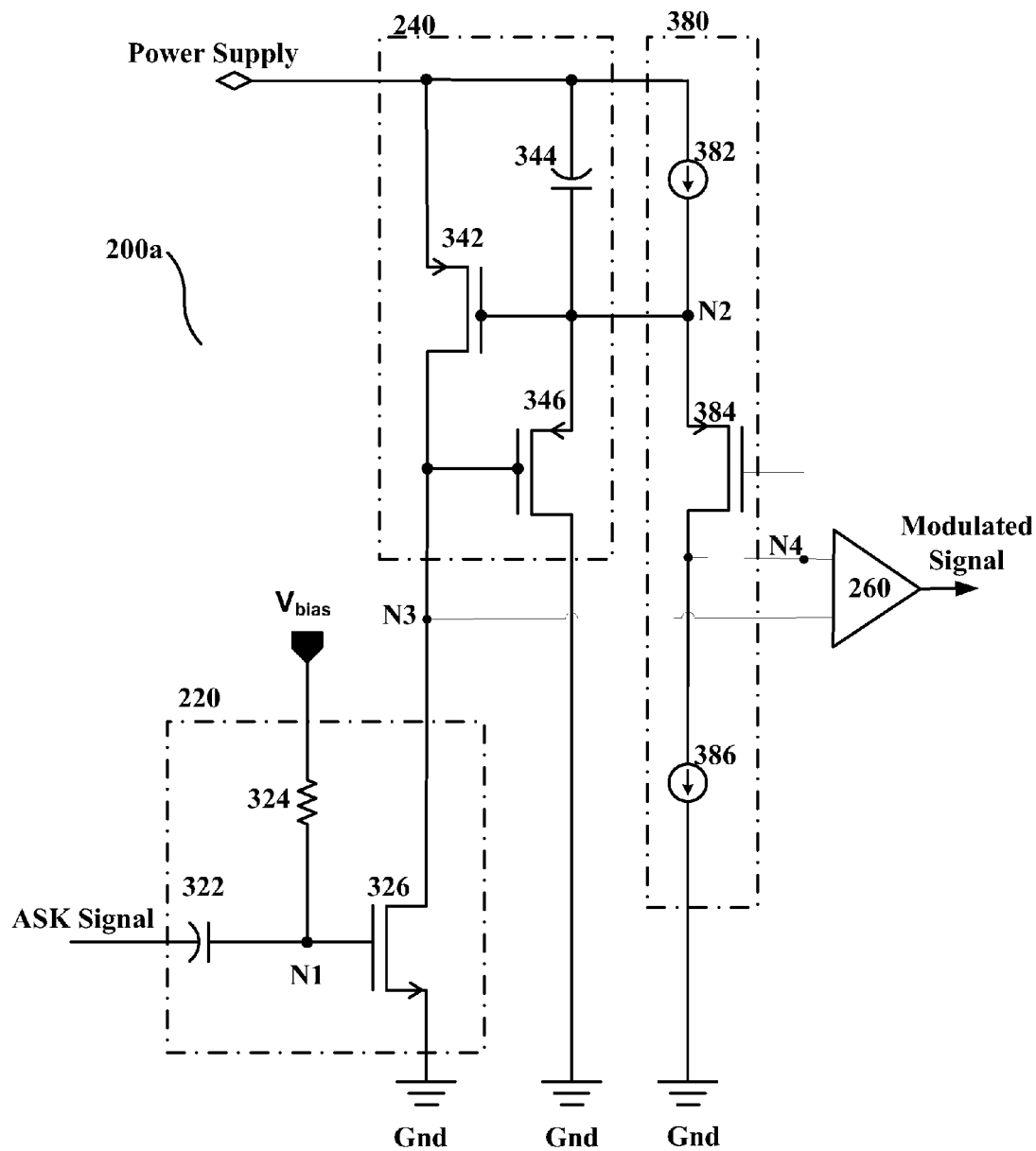
FIG. 3 is a drawing illustrating an ASK demodulator according to an embodiment of the invention.

FIG. 3 is a drawing illustrating an ASK demodulator 200a according to an embodiment of the invention. On the basis of the demodulator 200 shown in FIG. 2, the demodulator 200a further includes a reference voltage generation circuit 380 configured to generate the reference voltage.

In this embodiment, the rectification circuit 220 comprises a capacitor 322, a resistor 324 and a MOSFET 326. One end of the capacitor 322 configured to received the ASK signal and block any DC component thereof. One end of the resistor 324 is configured to receive a bias voltage for the rectification circuit 220. The other ends of the capacitor 322 and the resistor 324 are coupled to a gate of the MOSFET 326. A source of the MOSFET 326 is grounded, a drain of the MOSFET 326 is coupled to the active load circuit 240 and the comparator 260 and is configured to generate the voltage to be compared with the reference voltage. As described above, a rectified current (a drain to source current) can be generated based on the ASK signal by the MOSFET 326 with non-linearity.

The active load circuit comprises, as shown in FIG. 3, a MOSFET 342 (first MOSFET), a MOSFET 346 (second MOSFET) and a capacitor 344. The impedance presented by the circuit 240 is defined in equation (1):

$$R_o \sim \frac{1}{gm_1} \frac{1 + Sc/gm_2}{1 + \frac{SC}{gm_2 gm_1 Ron_1}} \quad (1)$$

Where gm1 is a transconductance of MOSFET 342, S is a complex frequency of the base band signal (i.e., jω), C is a capacitance of the capacitor 344, gm2 is a transconductance of the MOSFET 346, and Ron1 is a drain-source resistance of MOSFET 342.

Therefore, it can be derived from equation (1) that in DC condition, S=0 and Ro~1/gm1, in case the frequency of the base band signal is relatively high, $R_o$=Ron1, by using first-order approximate solution, the impedance can be defined in equation (2):

$$R_o = Ron1 = \frac{1}{\lambda I_{dc}} \quad (2)$$

Where λ is a constant and referred to as channel modulation coefficient, $I_{dc}$ is a DC current in the MOSFET 342 (i.e., the DC component of the rectified current).

Figure 4:
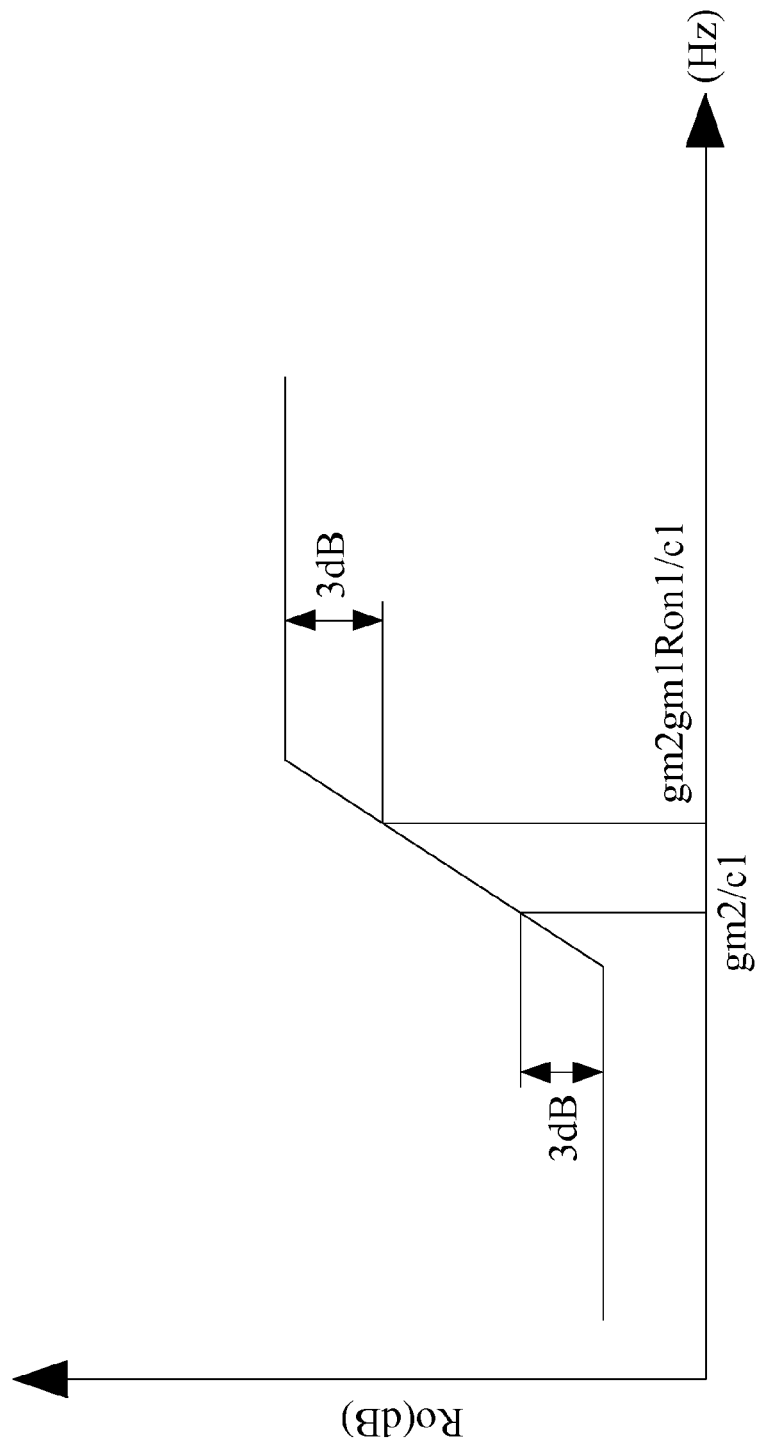
FIG. 4 is a drawing illustrating a relationship between an active load and a frequency of a base band signal according to an embodiment of the invention when a bias current is constant.

From equations (1) and (2), a relationship between the impedance presented by the active load circuit and the frequency of the base band signal (e.g., wakeup signal) when a bias current (determined by average power of the ASK signal) is constant can be determined as shown in FIG. 4, wherein a corner frequency is determined by gm2 and C.

Figure 5:
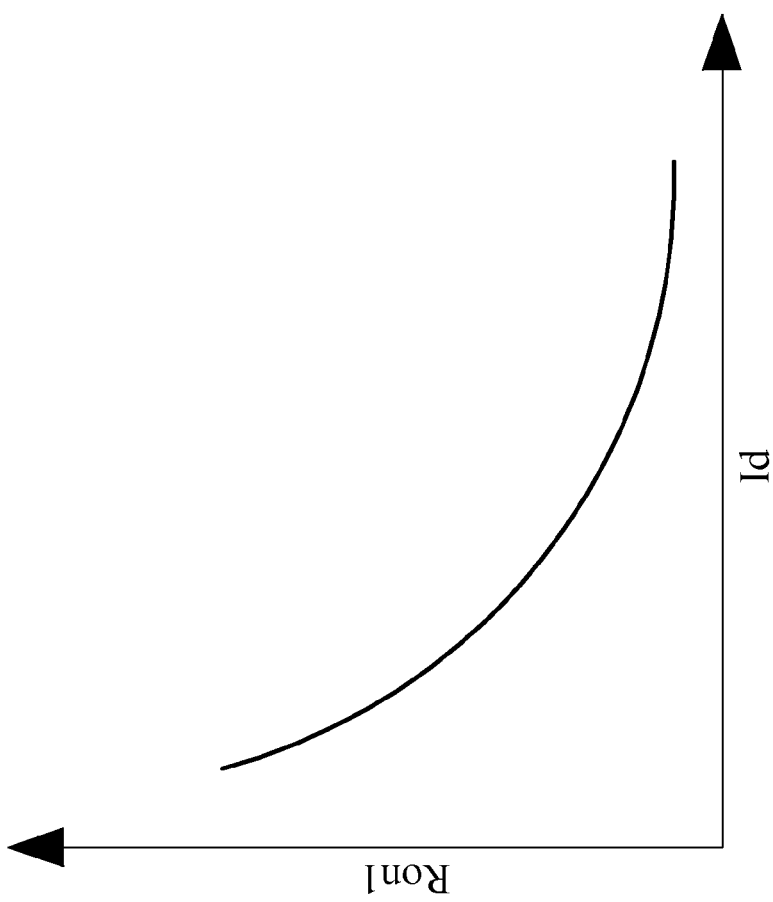
FIG. 5 is a drawing illustrating a relationship between an active load and a bias current according to an embodiment of the invention when a frequency of a base band signal is constant.

Referring to equation (2), when the frequency is higher than the corner frequency, the impedance presented by the active load circuit 240 may be as shown in FIG. 5. That is, the impedance is inversely proportional to the DC component of the rectified current in the MOSFET 326 which is determined by the average power of the ASK signal. In other words, the higher the DC component is, the lower the impedance is; the lower the DC component is, the higher the impedance is. Accordingly, the gain is scaled in response to the power of the ASK signal, in an embodiment, the gain gets lower by decreasing the impedance when the ASK signal is stronger, and the gain gets higher by increasing the impedance when the ASK signal is weaker (small signal).

Referring back to FIG. 3, the reference voltage generation circuit 380 comprises a current source (first current source) 382, a current source (second current source) 386 and a MOSFET (third MOSFET) 384. One end of the current source 382 is coupled to a power supply, the other end of the current source 382 is coupled to a source of the MOSFET 384, a gate and a drain of the MOSFET 384 is coupled to each other and further coupled to one end of the current source 386, the comparator 260, and are configured to provide the reference voltage (at N4).

In an embodiment, the reference voltage is an average of the voltage generated based on the rectified current and the impedance (i.e., generated at N3). The other end of the current source 386 is grounded. Specifically, a current provided by the current source 382 is twice a current provided by the current source 386, therefore a current flowing pass the MOSFET 346 will be the same as the current flowing pass the MOSFET 384. In absence of the ASK signal, the voltages at N3 and N4 are the same. When the ASK signal is received by the demodulator 200a, the voltage at N4 changes with an average power of the ASK signal and is equal to an average of the voltage at N3. The comparator 260 compares the voltages at N3 and N4 to generate the modulated signal which can be provided to the downstream circuit 120 (FIG. 1).

Figure 6:
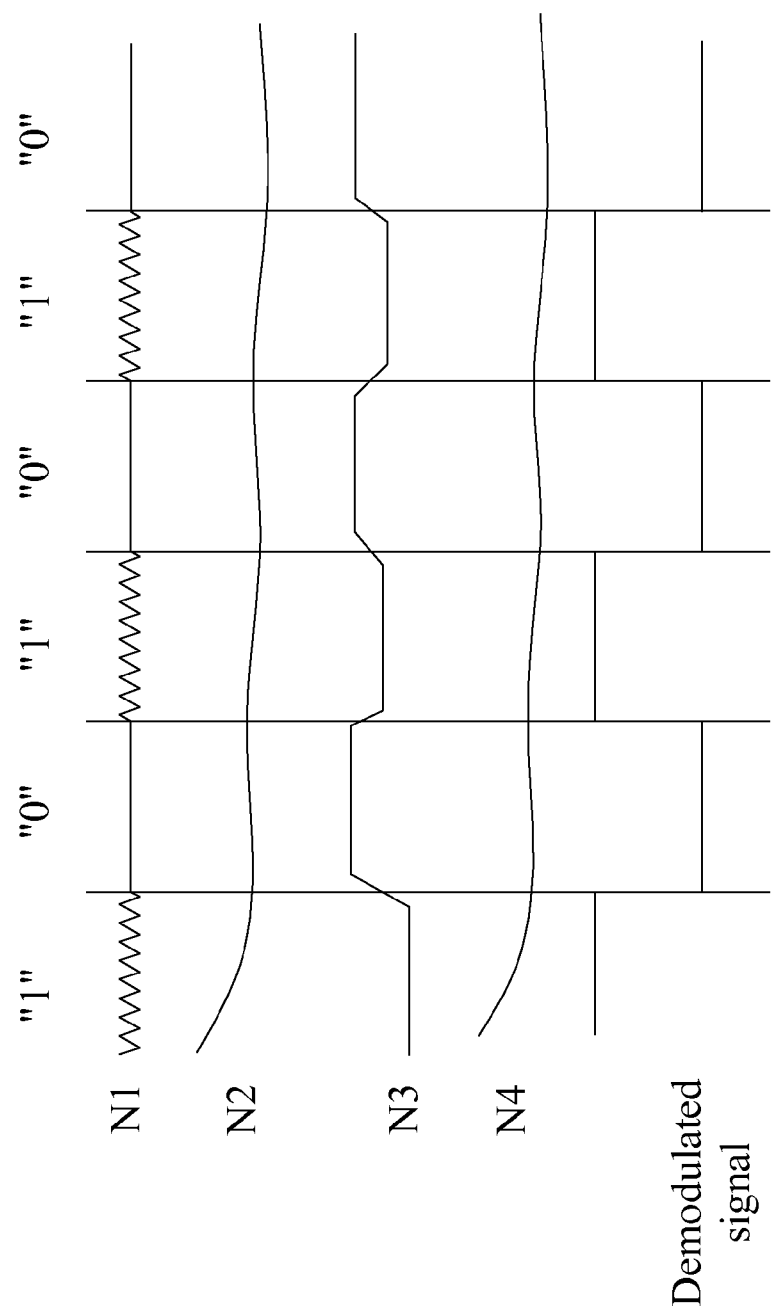
FIG. 6 is a drawing illustrating signals at different points in the ASK demodulator in FIG. 3.

FIG. 6 is a drawing illustrating signals at different points in the ASK demodulator in FIG. 3.

As shown in FIG. 6, it can be seen that in the demodulator 200a, even though there is no additional amplifier, the difference between the voltages at N3 and N4 are large enough for the comparator 260 to identify digital 1 and digital 0 in a base band signal (e.g., wakeup signal) appropriately.

A demodulator according to different embodiments of the invention can operate with a satisfying performance even though an ASK signal received is relatively strong and has a non-100% modulation depth. That is, such a demodulator has a broader dynamic range than conventional ASK demodulators.

Figure 7:
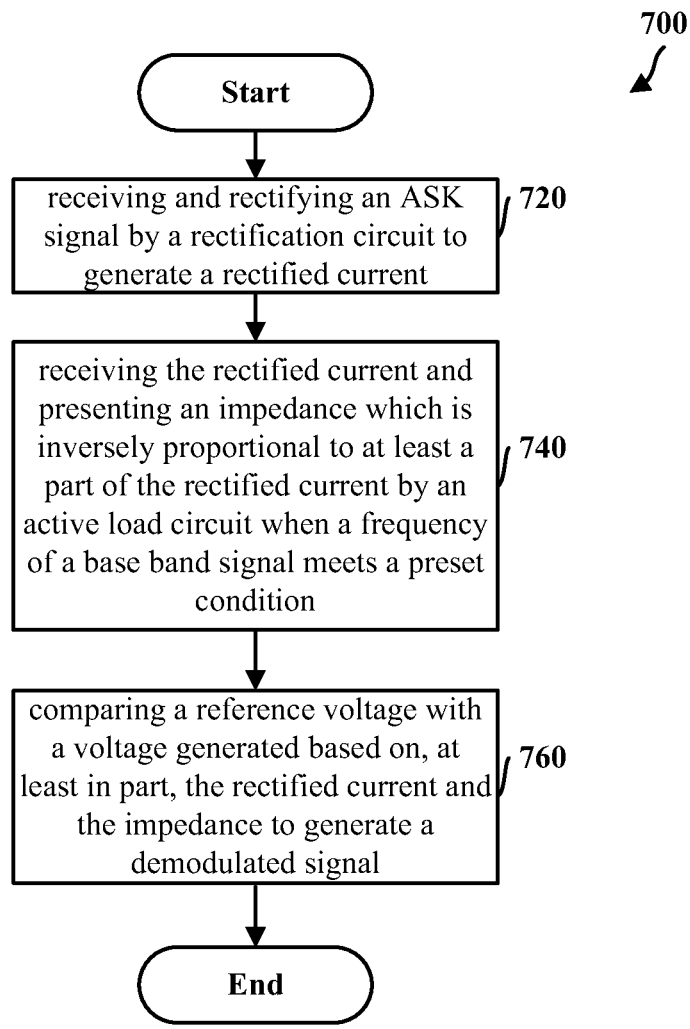
FIG. 7 is a flow chart illustrating a method for demodulating an ASK signal according to an embodiment of the invention.

FIG. 7 is a flow chart illustrating a method 700 for demodulating an ASK signal according to an embodiment of the invention. The method 700 will be described with reference to FIGS. 2, 3 and 7.

At block 720, the rectification circuit 220 (FIG. 3) receives and rectifies an ASK signal by a rectification circuit to generate a rectified current.

At block 740, the active load circuit 240 receives the rectified current and presents an impedance which is inversely proportional to at least a part of the rectified current by an active load circuit when a frequency of a base band signal meets a preset condition;

At block 760, the comparator 260 compares a reference voltage with a voltage generated based on, at least in part, the rectified current and the impedance to generate a demodulated signal.

In an embodiment, the reference voltage is an average of the generated voltage.

In an embodiment, the impedance is approximately equal to an inverse of a transconductance of the first MOSFET when the frequency of the base band signal is within a first frequency range, and wherein the impedance is inversely proportional to a direct current component of the rectified current when the frequency of the base band signal is within a second frequency range higher than a second corner frequency.

In an embodiment, the rectified current comprises a direct current component and an alternating current component, wherein the direct current component is determined by, at least in part, an average power of the ASK signal, and wherein the alternating current component is determined by, at least in part, a strength and modulation depth of the ASK signal.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An ASK demodulator, comprising:
a rectification circuit configured to receive and rectify an ASK signal to generate a rectified current;
an active load circuit coupled to the rectification circuit and configured to receive the rectified current and present an impedance which is inversely proportional to at least a part of the rectified current when a frequency of a base band signal meets a preset condition; and
a comparator coupled to the rectification circuit and the active load circuit and configured to receive a reference voltage and a voltage generated based on, at least in part, the rectified current and the impedance, and compare the reference voltage and the generated voltage to generate a demodulated signal;
wherein the active load circuit comprises:
a first MOSFET with a source coupled to a power supply and a drain coupled to the rectification circuit;
a capacitor with a first end coupled to the power supply and a second end coupled to a gate of the first MOSFET;
a second MOSFET with a source coupled to the gate of the first MOSFET and the second end of the capacitor, a gate coupled to the drain of the first MOSFET and a drain which is grounded.

2. The ASK demodulator of claim 1, further comprising a reference voltage generation circuit coupled to the comparator to provide the reference voltage which is an average of the generated voltage.

3. The ASK demodulator of claim 2, wherein the reference voltage generation circuit comprises:
a first current source with a first end coupled to the power supply;
a third MOSFET with a source coupled to a second end of the first current source, the gate of the first MOSFET, the second end of the capacitor and the source of the second MOSFET, a gate and a drain coupled to each other configured to generate the reference voltage; and
a second current source with a first end coupled to the drain and the gate of the third MOSFET and a second end which is grounded.

4. The ASK demodulator of claim 3, wherein the first current source is configured to provide a current which is twice a current provided by the second current source.

5. The ASK demodulator of claim 1, wherein the first MOSFET and the second MOSFET are P-type MOSFET.

6. The ASK demodulator of claim 1, wherein the impedance is approximately equal to an inverse of a transconductance of the first MOSFET when the frequency of the base band signal is within a first frequency range, and wherein the impedance is inversely proportional to a direct current component of the rectified current when the frequency of the base band signal is within a second frequency range higher than the first frequency range.

7. The ASK demodulator of claim 1, wherein the rectified current comprises a direct current component and an alternating current component, wherein the direct current component is determined by, at least in part, an average power of the ASK signal, and wherein the alternating current component is determined by, at least in part, a strength and modulation depth of the ASK signal.

* * * * *

UNITED STATES PATENT AND TRADEMARK OFFICE
CERTIFICATE OF CORRECTION

PATENT NO. : 8,508,293 B2  
APPLICATION NO. : 13/405632  
DATED : August 13, 2013  
INVENTOR(S) : Jiazhou Liu et al.

Page 1 of 1

It is certified that error appears in the above-identified patent and that said Letters Patent is hereby corrected as shown below:

Title Page, Item (75) Inventors:

The third inventor's name is "Yanfeng Wang" instead of "Yangeng Wang."

Signed and Sealed this  
Tenth Day of February, 2015

Michelle K. Lee  
*Deputy Director of the United States Patent and Trademark Office*